United States Patent
Lee et al.

(10) Patent No.: US 6,340,622 B1
(45) Date of Patent: Jan. 22, 2002

(54) METHOD FOR FABRICATING CAPACITORS OF SEMICONDUCTOR DEVICE

(75) Inventors: Kee Jeung Lee, Seoul; Kwang Chul Joo, Kyoungki-do, both of (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/708,436

(22) Filed: Nov. 9, 2000

(30) Foreign Application Priority Data

Nov. 9, 1999 (KR) .............................. 99-49499

(51) Int. Cl.$^7$ .............................................. H01L 21/20
(52) U.S. Cl. ...................... 438/396; 438/240; 438/253
(58) Field of Search ........................ 438/3, 240, 396, 438/397, 398, 253, 254, 255

(56) References Cited

U.S. PATENT DOCUMENTS 5,248,629 A * 9/1993 Muroyama
6,180,452 B1 * 1/2001 Hwang ........................ 438/785
6,204,203 B1 * 3/2001 Narwankar et al. .......... 438/785

OTHER PUBLICATIONS

Sun et al., "Novel Approach for Leakage Current Reduction of LPCVD Ta2O5 and TiO2 Films by Rapid Thermal N2O Annealing", IEDM 1994, pp. 333–336.*

Sun et al., "Reduction of Leakage Current in Chemical-–Vapor–Deposited Ta2O5 Thin Films by Furnace N2O Annealing", IEEE Transactions on Electron Devices, vol. 44, No. 6, 6/97, pp. 1027–1029.*

* cited by examiner

Primary Examiner—Tuan H. Nguyen
(74) Attorney, Agent, or Firm—Pillsbury Winthrop LLP

(57) ABSTRACT

Disclosed is a method for fabricating capacitors of a semiconductor device. This method includes A method for fabricating a capacitor of a semiconductor device, comprising the steps of forming a lower electrode on a semiconductor substrate formed with diverse structures required for a fabrication of a semiconductor device, depositing an amorphous TaON thin film over the lower electrode, and subjecting the deposited amorphous TaON thin film to a low-temperature thermal process and a high-temperature thermal process, thereby forming a TaON dielectric film, and forming an upper electrode on the TaON dielectric film. Since the TaON thin film is used as a dielectric film, it is possible to achieve an improvement in electrical characteristics while ensuring a capacitance required in the semiconductor device.

20 Claims, 2 Drawing Sheets

METHOD FOR FABRICATING CAPACITORS OF SEMICONDUCTOR DEVICE

BACKGROUND OF THE INVENTION

1. Field of the Invention

The present invention relates to a method for fabricating capacitors for semiconductor devices and, more particularly, to a method for fabricating capacitors that exhibit both the improved electrical characteristics and the high capacitance values required for advanced semiconductor devices.

2. Description of the Related Art

As is well known, recent developments in semiconductor processing techniques have allowed the successful production of semiconductor products having increasingly high levels of integration. As a result, active research and development efforts continue to be directed toward both reducing cell area and reducing the device operating voltage.

Although high levels of device integration greatly reduce the wafer area available for capacitor formation, the charge capacity preferred for operation of a memory device remains on the order of 25 fF or more per cell despite the reduction in cell area. This level of charge capacity is useful in preventing the generation of soft errors and reducing the refresh time.

Conventional DRAM capacitors commonly use a dielectric film having a stacked nitride/oxide (NO) structure and a three-dimensional lower electrode structure to increase the effective electrode area to obtain sufficient capacitance values.

However, the processing complexities and difficulties inherent in forming such three-dimensional lower electrode structures limits the ability of such processes to provide sufficient capacitance in a consistent and predictable manner. In those instances in which the height of the lower electrode is increased, the depth of focus and dimension control that can be obtained during subsequent photolithography processes may be insufficient to accurately reproduce the necessary patterns. This is because the increased height of the lower electrode produces severe topology differences between the cell and peripheral circuit regions. These topology differences have an adverse effect on subsequent integration processes conducted after a wiring process.

Thus, capacitors utilizing the conventional NO structure are frequently limited in their ability to provide the levels of capacitance required to support the next generation memories having 256 M or more cells.

In order to overcome the limitations associated with conventional NO capacitors and the dielectric constant of 4 to 5 provided by the NO film, a $Ta_2O_5$ thin film capable of providing a dielectric constant of 25 to 27 has been proposed as an alternate dielectric film. The higher dielectric constant of the $Ta_2O_5$ film permits the construction of capacitors having substantially higher capacitance than similarly sized NO capacitors.

In a nominal $Ta_2O_5$ thin film, however, substitutional Ta atoms inevitably exist as a result of composition ratio variations between Ta and O atoms within the film. The nominal stoichiometry, although convenient, does not reflect the inherent chemical instability of the $Ta_2O_5$ thin film. In other words, substitutive Ta atoms in the form of oxygen vacancies are always present in the $Ta_2O_5$ thin film due to the variable and unstable stoichiometry of the $Ta_2O_5$ material.

Furthermore, although the number of oxygen vacancies may be varied somewhat depending on the actual composition and bonding degrees of the incorporated elements, the oxygen vacancies cannot be completely removed from the dielectric thin film.

In order to prevent generation of leakage current in the $Ta_2O_5$ capacitors, therefore, it is necessary to perform a separate oxidation process to stabilize the stoichiometry of the $Ta_2O_5$ thin film by oxidizing the substitutive Ta atoms present in the dielectric thin film.

Moreover, the $Ta_2O_5$ thin film may act as a strong oxidizer when in contact with polysilicon (oxide-based electrodes) or TiN (metal-based electrodes), two materials commonly used in forming the upper and lower electrodes of the capacitors. As a result, oxygen present in the $Ta_2O_5$ thin film may migrate to the interfaces between the dielectric layer and the electrodes and react with the electrode materials, thereby forming low-dielectric oxide layers and degrading the uniformity and electrical properties of those interfaces.

During the formation of the $Ta_2O_5$ thin film, the organic portions from the $Ta(OC_2H_5)_5$, a precursor compound used in forming the $Ta_2O_5$ film, can react with $O_2$ or $N_2O$ gas during the LPCVD process to form various impurities including carbon (C), carbon compounds (such as $CH_4$ and $C_2H_4$), and water vapor ($H_2O$), that can be incorporated into the $Ta_2O_5$ thin film. As a result of these impurities, as well as other ions, free radicals, and oxygen vacancies present in the $Ta_2O_5$ film, the resulting capacitors tend to exhibit increased leakage current and degraded dielectric characteristics.

SUMMARY OF THE INVENTION

The method according to the present invention has been developed to overcome the above mentioned problems and limitations experienced and/or inherent in prior art processes and materials. It is an object of the invention to provide a method for fabricating capacitors for semiconductor devices that exhibit improved electrical characteristics while ensuring sufficient capacitance to support next generation semiconductor devices.

Another object of the invention is to provide a method for fabricating capacitors for semiconductor devices that renders unnecessary certain process steps designed to increase the effective capacitor area and thus ensure a sufficiently high capacitance. By allowing these steps to be eliminated, the present invention simplifies the manufacturing process by reducing the number of processing steps, thereby also reducing both the processing time and the associated manufacturing costs.

Another object of the present invention is to provide a method for fabricating capacitors for semiconductor devices that render unnecessary certain thermal and oxidation processes prior to the formation of a dielectric film. By allowing these steps to be eliminated, the present invention further reduces the manufacturing costs and improves productivity.

In one embodiment, the present invention provides a method for fabricating capacitors for semiconductor devices comprising the steps of: forming a lower electrode on a semiconductor substrate that incorporates a variety of previously formed and diverse structures necessary for proper functioning of the final semiconductor device; depositing an amorphous TaON thin film over the lower electrode, and subjecting the deposited amorphous TaON thin film to a low-temperature thermal process and a high-temperature thermal process, thereby forming a TaON dielectric film; and forming an upper electrode on the TaON dielectric film.

In another embodiment, the present invention provides a method for fabricating a capacitor of a semiconductor device, comprising the steps of: forming a lower electrode on a semiconductor substrate formed with diverse structures required for a fabrication of a semiconductor device; nitriding a surface of the lower electrode to form a nitride film on the lower electrode, forming an amorphous TaON thin film over the nitride film and subjecting the amorphous TaON thin film to a low-temperature thermal process at a temperature of 300 to 500° C.; then subjecting the TaON thin film to a high-temperature thermal process at a temperature of 650 to 950° C., thereby forming a TaON dielectric film; and forming an upper electrode on the TaON dielectric film.

In another embodiment, the present invention provides a method for fabricating capacitors for semiconductor devices comprising the steps of: forming a lower electrode on a semiconductor substrate that incorporates a variety of previously formed and diverse structures necessary for proper functioning of the final semiconductor device; forming a nitride film adapted to nitrify an upper surface of the lower electrode; forming an amorphous TaON thin film over the lower electrode; subjecting the amorphous TaON thin film to a low-temperature thermal process at a temperature of 300 to 500° C.; subjecting the TaON film to a high-temperature thermal process at a temperature of 650 to 950° C., thereby forming a TaON dielectric film; and forming an upper electrode on the TaON dielectric film.

The above objects, as well as other features and advantages of the present invention will become more apparent in light of the following detailed description and the accompanying figures.

DESCRIPTION OF THE PREFERRED EMBODIMENTS

A method for fabricating capacitors for semiconductor devices according to the present invention is described in detail below and illustrated in the incorporated figures.

Figure 1:
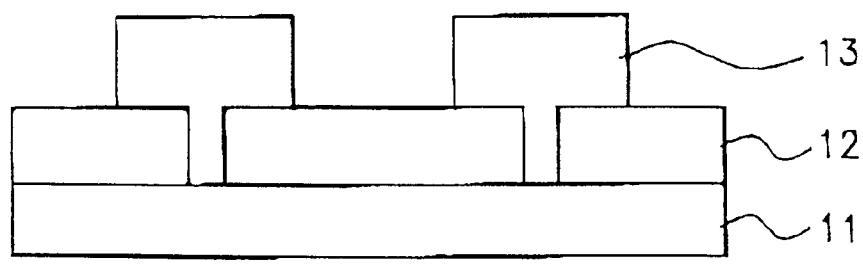
FIGS. 1 to 4 provide a series of sequential cross-sectional views illustrating the various layers and processing steps in a method for fabricating capacitors for semiconductor devices in accordance with the present invention.

In fabricating capacitors according to the method of the present invention, an interlayer insulating film 12 is first formed over a semiconductor substrate 11. It will be appreciated that the semiconductor substrate has already undergone extensive processing and includes numerous structures and elements that, although not reflected in the Figures, are required to produce a functional device. Contact openings are then formed at predetermined locations in the interlayer insulating film 12. After the lower electrodes 13 are formed, these contact openings provide a contact path between the semiconductor substrate 11 and the lower electrodes 13 as illustrated in FIG. 1.

A layer of conductive material is then formed over the interlayer insulating film 12 with contact between the conductive material and the semiconductor substrate 11 provided through the contact openings. The conductive material layer is then patterned and etched to form the lower electrodes 13 of the capacitors.

The lower electrodes 13 may be made of a silicon-based material such as doped polysilicon or doped amorphous silicon. Alternatively, the lower electrodes 13 may be made of a metal-based material such as TiN, TaN, W, WN, WSi, Ru, $PuO_2$, Ir, $IrO_2$, or Pt.

The lower electrodes 13 may be configured as a simple stacked structure or a more complex three-dimensional structure, such as a double structure including a step structure or a triple structure including a fin structure. The lower electrode 13 illustrated in FIGS. 1–4 reflects a cross section through a cylindrical structure in which the vertical walls serve to increase the effective electrode area. Additionally, the lower electrodes 13 may be formed with polysilicon having a hemispherical grain (HSG) structure, thereby further increasing the effective electrode area.

Figure 2:
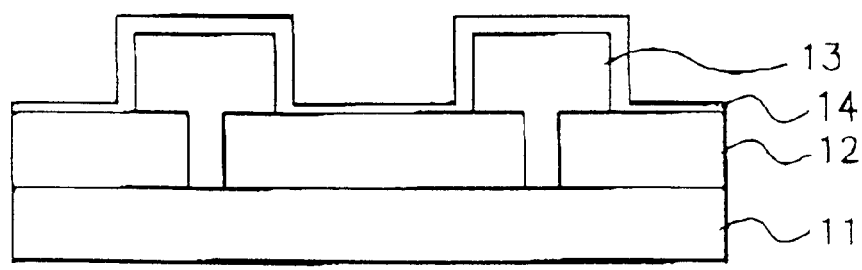

The lower electrodes 13 are then subjected to a nitrification process. As a result, a nitride film 14 is formed on the surface of each lower electrode 13, as shown in FIG. 2.

The nitride film 14 is added to prevent the formation of a natural silicon dioxide film ($SiO_2$) on the lower electrode. The nitride film 14 will also prevent the formation of a silicon dioxide layer at the interface between the lower electrode and the dielectric layer during the subsequent formation of the dielectric layer or during other subsequent thermal processing. Suppression of the silicon dioxide film formation is necessary because silicon dioxide has a low dielectric constant and will degrade the performance of the resulting capacitor if present.

The nitride film 14 may be formed on the lower electrodes 13 by discharging plasma in an in-situ or ex-situ fashion in a low-pressure chemical vapor deposition (LPCVD) chamber before forming the dielectric film. In this process step, the exposed surfaces of the lower electrodes 13 are nitrified in an ammonia ($NH_3$) or a forming gas ($N_2/H_2$) atmosphere while the semiconductor substrate 11 is maintained at a temperature of 300 to 500° C.

As an alternative to the plasma nitrification method described above, the nitride film 14 may be formed using a rapid thermal process (RTP) conducted in an $NH_3$ atmosphere at a temperature of 650 to 950° C. The nitride film 14 may also be formed in an electric furnace using an $NH_3$ atmosphere at a temperature of 500 to 1,000° C.

To avoid or reduce the formation of a natural oxide film ($SiO_2$) at the interface between the lower electrodes and the dielectric film during a formation of the dielectric film or during the subsequent thermal processes, another method may be used that does not require the formation of nitride film 14. According to this alternative method, any natural oxide film present on the surfaces of the lower electrodes 13 is removed using HF vapor or an HF solution. The dielectric film is then formed almost immediately after the natural oxide film is removed to prevent the normal regeneration of the natural oxide.

Furthermore, the surfaces of lower electrodes 13 may be cleaned using a $NH_4OH$ solution, a $H_2SO_4$ solution, or a combination thereof before and/or after the HF cleaning process. By applying one or more of these cleaning steps, followed by the rapid deposition of the dielectric film, it is possible to obtain a dielectric film exhibiting improved uniformity without the need for the nitrification process discussed previously.

Therefore, to increase the oxidation resistance of the lower electrode prior to the formation of the dielectric film, the surface of each lower electrode 13 may be nitrified using plasma or a rapid thermal process in an $NH_3$ atmosphere or $N_2/H_2$ atmosphere at temperatures of 300 to 950° C.

Alternatively, the surface of each lower electrode 13 may be thermally treated in a $NO_2$ or $O_2$ atmosphere Such a treatment makes it possible to eliminate structural defects or heterogeneity resulting from dangling bonds, thereby improving the leakage current characteristics of the resulting capacitors.

Figure 3:
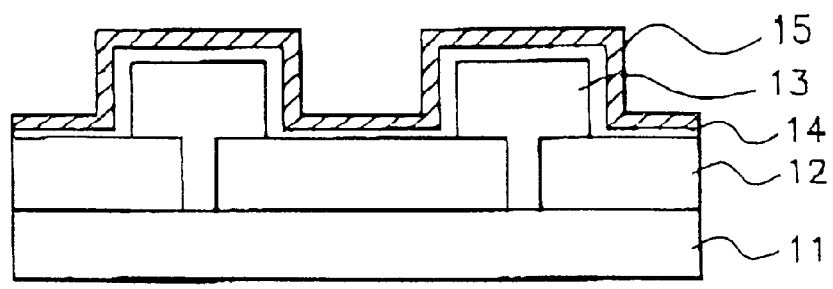

Thereafter, a TaON thin film, which is to be used as the dielectric film, is formed over the upper surface of the structure formed with the nitride film 14, as shown in FIG. 3.

The formation of the TaON thin film 15 is achieved by introducing a vaporized Ta compound into a low-pressure chemical vapor deposition (LPCVD) chamber that is maintained at a temperature of 300 to 600° C. and a pressure of not more than 10 Torr. An additional reaction gas, either $NH_3$ gas at a rate of 10 to 1,000 sccm or $O_2$ gas at a rate of up to 300 sccm, is also introduced into the LPCVD via a mass flow controller (MFC) to generate a chemical reaction at the surface of the wafer. This chemical reaction produces an amorphous thin film of TaON, preferably having a thickness of 50 to 150 Å, that is then subjected to a low-temperature thermal process followed by a seond and high-temperature thermal process to convert the amorphous TaON film into a more crystalline structure.

For the Ta compound vapor, a solution of $Ta(OC_2H_5)_5$, preferably having a purity of at least 99.99%, is introduced through a flow controller, at a rate of not more than 100 mg/minute, into an evaporator or evaporating tube that is maintained at a temperature of 150 to 200° C., where the solution is completely evaporated.

During this process, the components between the evaporator and the LPCVD chamber, including any orifice or nozzle and all supply tubes that provide a flow path for the Ta compound vapor, are maintained at a temperature of 150 to 200° C. to prevent condensation of the Ta compound vapor.

The low-temperature thermal process conducted after the formation of the amorphous TaON thin film 15 is carried out in a $UV-O_3$ atmosphere at a temperature of 300 to 500° C.

During the low-temperature thermal process, oxygen vacancies, organic impurities, and substitutive Ta atoms remaining in the TaON thin film 15 are oxidized. During this low-temperature process, the TaON thin film retains its amorphous configuration. This low-temperature process does, however, substantially reduce the numbers of those defects and contaminants that would tend to generate leakage currents within the film.

The high-temperature thermal process following the low-temperature thermal process is preferably performed in an electric furnace maintained at a temperature of 650 to 950° C. under a $N_2O_2$, or N atmosphere for 5 to 30 minutes.

In the high-temperature thermal process, those volatile carbon compounds remaining in the amorphous TaON thin film after the low-temperature thermal process are completely removed. Accordingly, the high-temperature thermal process induces crystallization of the amorphous TaON thin film 15 while removing additional defects and contamination that would generate a leakage current, thereby increasing the dielectric constant of the dielectric layer and improving its electrical properties.

Figure 4:
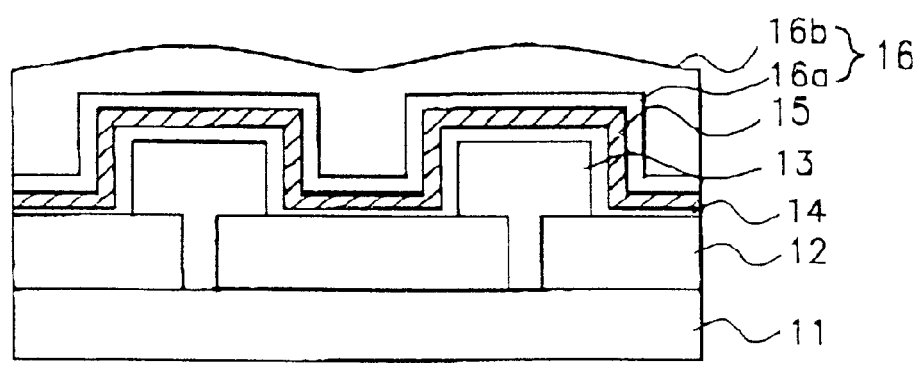

Finally, upper electrodes 16 are formed on the TaON thin film 15, as shown in FIG. 4 to complete the fabrication of capacitors according to the invention.

The upper electrodes 16 may be formed by depositing a metal material layer 16a, preferably comprising a metal-based material such as TiN, TaN, W, WN, WSi, Ru, $RuO_2$, Ir, $IrO_2$, or Pt, over the TaON thin film 15. Alternatively, the upper electrodes 16 may be formed by depositing a metal-based material layer 16a to a thickness of 100 to 600 Å over the TaON thin film 15, and then depositing, over the metal material layer 16a, a doped polysilicon buffer layer 16b adapted to prevent degradation of the electrical characteristics of the capacitors during subsequent thermal processes.

As is apparent from the above description, the method for fabricating capacitors for semiconductor devices according to the present invention provides various effects and improvements over the prior art methods. The TaON thin film formed according to the present invention is characterized by a dielectric constant of 23 to 25 and a highly stable Ta—O—N chemical bonding structure. When compared with a conventional NO thin film dielectric, the TaON dielectric provides a dielectric constant between 4 and 5 times greater, making TaON dielectrics much more capable of supporting the next generation semiconductor devices. Further, when compared with a conventional $Ta_2O_5$ thin film dielectric, the TaON dielectric provides improved structural and stoichiometric stability. The TaON thin film of the present invention also exhibits superior resistance against electrostatic discharge (ESD) induced damage.

In particular, the method of the present invention provides a means of effectively suppressing oxidation at the interfaces between the TaON thin film and the upper and lower electrodes, both during the TaON deposition and during subsequent thermal processes. By suppressing oxidation at the interfaces, the TaON thin film provides a controllable and stable dielectric constant despite having a dielectric constant nominally lower than those of $Ta_2O_5$ thin film dielectrics. The inevitable oxidation at the electrode interfaces associated with the $Ta_2O_5$ dielectric layers degrades the overall dielectric constant and thus lowers the charge capacity of the resulting capacitor.

In other words, the TaON thin film of the present invention eliminates as potential sources of leakage current the oxygen vacancies and organic impurities inherent in conventional $Ta_2O_5$ dielectric layers having unstable stoichiometry.

Because the present invention suppresses formation of a low-dielectric oxide film at the interface between the lower electrode and the dielectric film, the present invention makes it possible to avoid generating leakage currents associated with a non-uniform oxide film while simultaneously and consistently producing capacitors having an effective oxide film thickness of 35 Å or less.

Therefore, when the TaON dielectric film according to the present invention is used as a dielectric film, it is possible to produce the capacitors having a capacitance of 25 fF or more per cell required for next-generation DRAM products of a 256 M grade or higher despite the reduced unit cell area necessary to reach these levels of device integration.

Even when a capacitor having a simple stacked structure is used, sufficient capacitance is obtained when a TaON thin film dielectric is used in accordance with the present invention. The increase in dielectric constant provided by the TaON film makes it unnecessary to increase the effective lower electrode area through the use of more complex capacitor configurations to obtain sufficient capacitance with conventional prior art dielectrics. Eliminating the need for these more complex configurations reduces the number of unit processing steps and provides corresponding reductions in the processing time and manufacturing costs.

In accordance with the present invention, it is also unnecessary to use a rapid thermal processing and a multi-stage low-temperature oxidation process to treat the lower electrode prior to the deposition of a $Ta_2O_5$ thin film in the fabrication of conventional $Ta_2O_5$ capacitors. Accordingly, the present invention provides an additional level of economical advantage in terms of reduced manufacturing costs and increased productivity.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor of a semiconductor device, comprising the steps of:
    forming a lower electrode having an exposed surface on a semiconductor substrate, the lower electrode having a surface composition adjacent the exposed surface and a bulk composition, the surface composition and the bulk composition being substantially the same;
    depositing an amorphous TaON thin film over the exposed surface of the lower electrode;
    subjecting the deposited amorphous TaON thin film to a first thermal process at a first temperature;

subjecting the TaON thin film to a second thermal process at a second temperature, the second temperature being greater than the first temperature and sufficiently high to form a substantially crystalline TaON dielectric film; and forming an upper electrode on the TaON dielectric film; wherein the step of subjecting the TaON thin film to a second thermal process comprising a final anneal before the step of forming the upper electrode.

2. The method according to claim 1, wherein the lower electrode comprises doped polysilicon or doped amorphous silicon.

3. The method according to claim 1, wherein the lower electrode comprises polysilicon, the polysilicon having a hemispherical grain structure on its surface.

4. The method according to claim 1, wherein the lower electrode comprises a major portion of one material selected from the group consisting of TiN, Ti, TaN, W, WN, WSi, Ru, $RuO_2$, Ir, $IrO_2$, and Pt.

5. The method according to claim 1, further comprising the step of modifying the surface composition of the lower electrode to form a nitride film on the exposed surface of the lower electrode; this step being completed before performing the step of depositing the amorphous TaON thin film.

6. The method according to claim 5, wherein the nitride film is formed by discharging plasma in a low-pressure chemical vapor deposition chamber, the low-pressure chemical vapor deposition chamber having an $NH_3$ or a $N_2/H_2$ atmosphere and a pressure below about 10 Torr, while maintaining the semiconductor substrate at a temperature between 300° C. and 500° C.

7. The method according to claim 5, wherein the nitride film is formed using a rapid thermal process conducted in an $NH_3$ atmosphere at a temperature of 650 to 950° C.

8. The method according to claim 5, wherein the nitride film is formed in a furnace having an $NH_3$ atmosphere at a temperature of 500 to 1,000° C.

9. The method according to claim 1, further comprising the step of removing any silicon oxide film present on the exposed surface of the lower electrode, the removal being achieved using an HF solution or an HF compound, the step being completed before the step of depositing the amorphous TaON thin film.

10. The method according to claim 1, wherein the amorphous TaON thin film has a thickness between 50 Å and 150 Å and further wherein the step of depositing the amorphous TaON thin film comprises simultaneously introducing controlled amounts of both a Ta compound vapor and a reaction gas, the reaction gas comprising $NH_3$ and optionally $O_2$, into a low-pressure chemical vapor deposition chamber, the low-pressure chemical vapor deposition chamber being maintained at a temperature of 300 to 600° C. and a pressure of not more than 10 Torr, to generate a surface chemical reaction on the semiconductor substrate.

11. The method according to claim 10, wherein the step of introducing the Ta compound vapor further comprises introducing a $Ta(OC_2H_5)_5$ solution into an evaporating means, the $Ta(OC_2H_5)_5$ solution being introduced at a controlled rate of not more than 100 mg/minute, and the evaporating means being maintained at a temperature of 150 to 200° C., to form the Ta compound vapor.

12. The method according to claim 1, wherein the first thermal process is carried out in an $UV-O_3$ atmosphere maintained at a temperature of 300 to 500° C.

13. The method according to claim 1, wherein the second thermal process is carried out in a furnace maintained at a temperature of 650 to 950° C. and under an atmosphere of $N_2O$, $O_2$, or $N_2$.

14. The method according to claim 1, wherein the upper electrode comprises a major portion of one material selected from the group consisting of TiN, Ti, TaN, W, WN, WSi, Ru, $RuO_2$, Ir, $IrO_2$, and Pt.

15. The method according to claim 1, wherein the step of forming the upper electrode further comprises the steps of:

forming a metal-based material layer on the TaON dielectric film, the metal-based material layer having a thickness of between 100 Å and 600 Å; and then forming a doped polysilicon layer over the metal-based material layer.

16. The method according to claim 15, wherein the metal-based material layer comprises a major amount of a metal-based material selected from the group consisting of TiN, Ti, TaN, W, WN, WSi, Ru, $RuO_2$, Ir, $IrO_2$, and Pt.

17. A method for fabricating a capacitor for a semiconductor device, comprising the steps of:

forming a lower electrode on a semiconductor substrate;

forming an amorphous TaON thin film over the lower electrode;

subjecting the amorphous TaON thin film to a low-temperature thermal process at a temperature of 300 to 500° C.;

subjecting the TaON thin film to a high-temperature thermal process at a temperature of 650 to 950° C., thereby forming a substantially crystalline TaON dielectric film; and forming an upper electrode on the TaON dielectric film.

18. The method according to claim 17, further comprising the step of forming a nitride film adapted to nitrify the exposed surfaces of the lower electrode, this step being completed before performing the step of forming the amorphous TaON dielectric film.

19. A method for fabricating a capacitor of a semiconductor device, comprising the steps of:

forming a lower electrode on a semiconductor substrate formed with diverse structures required for a fabrication of a semiconductor device;

nitriding a surface of the lower electrode to form a nitride film on the lower electrode;

forming an amorphous TaON thin film over the nitride film and subjecting the forming amorphous TaON thin film to a low-temperature thermal process at a temperature of 300 to 500° C.;

subjecting the TaON thin film to a high-temperature thermal process at a temperature of 650 to 950° C., thereby forming a substantially crystalline TaON dielectric film; and forming an upper electrode on the TaON dielectric film.

20. The method according to claim 19, wherein the nitride film is formed using a rapid thermal process conducted in an $NH_3$ atmosphere at a temperature of 650 to 950° C.

* * * * *